United States Patent
Leizerovich

(10) Patent No.: US 6,904,268 B2
(45) Date of Patent: Jun. 7, 2005

(54) LOW NOISE LINEAR TRANSMITTER USING CARTESIAN FEEDBACK

(75) Inventor: Gustavo D. Leizerovich, Aventura, FL (US)

(73) Assignee: Motorola, Inc., Schaumburg, IL (US)

( * ) Notice: Subject to any disclaimer, the term of this patent is extended or adjusted under 35 U.S.C. 154(b) by 438 days.

(21) Appl. No.: 10/261,228

(22) Filed: Sep. 30, 2002

(65) Prior Publication Data

US 2004/0063408 A1 Apr. 1, 2004

(51) Int. Cl.[7] ................................................ H04B 1/04
(52) U.S. Cl. .................. 455/126; 455/67.13; 455/114.3
(58) Field of Search ............................ 455/129, 127.2, 455/39, 501, 63.1, 67.13, 68, 69, 73, 75, 76, 85, 86, 87, 88, 570, 91, 95, 114.2, 114.3

(56) References Cited

U.S. PATENT DOCUMENTS

| | | | |
|---|---|---|---|
| 5,333,176 A | * 7/1994 | Burke et al. ................ 455/557 |
| 5,420,536 A | 5/1995 | Faulkner et al. | |
| 5,469,105 A | 11/1995 | Sparks | |
| 5,890,051 A | * 3/1999 | Schlang et al. ............. 455/76 |
| 5,933,767 A | 8/1999 | Leizerovich | |
| 6,112,059 A | * 8/2000 | Schwent et al. ........... 455/67.11 |
| 6,169,912 B1 | * 1/2001 | Zuckerman ................ 455/570 |

* cited by examiner

Primary Examiner—Edward F. Urban
Assistant Examiner—Thuan Nguyen
(74) Attorney, Agent, or Firm—Scott M. Garrett

(57) ABSTRACT

A transmitter (100) uses a low noise up mixer (112) so that no filter is needed at the output of the up mixer. A Cartesian feedback path (122) enhances the linearity of the transmitter, and provides a feedback signal that is subtracted from a baseband signal (118) that is generated by a baseband signal generator (120). The subtraction is performed by a combiner (116) and produces an amplified error signal (111). A gain control circuit (130) samples the baseband signal and the amplified error signal, and determines a ratio of these signal levels. The gain control circuit compares the present ratio value with a preferred ratio value, and adjusts the gain of the power amplifier (102) so as to keep the present ratio value substantially equal to the preferred ratio value. By doing so, the gain of the power amplifier, which tends to change with temperature, voltage, and frequency, is prevented from over amplifying the out of band spectral content added by the up mixer, and ensures that the out of band spectral content remains below a specified level.

11 Claims, 2 Drawing Sheets

LOW NOISE LINEAR TRANSMITTER USING CARTESIAN FEEDBACK

TECHNICAL FIELD

This invention relates in general to transmitters, and more particularly to low noise transmitters using linear modulation and Cartesian feedback.

BACKGROUND OF THE INVENTION

Linear transmitters are used in a wide variety of application, including mobile communications. In particular, linear transmitters are used in digital communications because of the excellent spectrum efficiency they offer. The spectral efficiency of linear modulation is the reason why it is fast becoming the preferred wireless data transmission modulation in many fields.

A typical linear transmitter includes a baseband signal generator that produces a baseband signal output in response to a digital input. The digital input is mapped to a constellation corresponding to output voltage level and phase. An example of such a modulation is known as quadrature amplitude modulation (QAM), which is a popular form of modulation. The baseband signal is fed to an up mixer to create a radio frequency signal, which is then filtered and fed to a power amplifier for transmission over the air.

In some applications increased linearity was desired, and Cartesian feedback was found to significantly enhance linearity. Cartesian feedback comprises sampling the output of the power amplifier, down mixing it at the same frequency the up mixer uses but at a phase delay, then feeding the down mixed signal back to a combiner or summing node and subtracted from the output of the baseband signal generator. Instead of feeding the baseband signal directly to the up mixer, the difference of the baseband signal and the down mixed signal is amplified and fed to the up mixer. Cartesian feedback is discussed in, for example, U.S. Pat. No. 5,420,536 to Faulkner, and U.S. Pat. No. 5,933,767 to Leizerovich et al.

In mobile applications the gain of the transmitter's power amplifier becomes an important consideration because increased gain results in excessive out of band noise which may interfere with nearby receiver, while decreased gain may result in insufficient transmit power. Nearby receivers may be affected by out of band noise because the out of band noise in the transmit signal may intrude into the receive frequency band of a nearby receiver. This is particularly true in time and frequency divisioned communication systems where transmit and receive frequency pairs are used. In mobile communication devices, which experience significant changes in temperature over relatively short periods of time, the gain of the power amplifier can change during transmission. If the gain of the power amplifier goes up, the increase in gain is automatically compensated by use of a Cartesian feedback loop which reduces the level of the signal fed to the upmixer. This method proved adequate when used with significant filtering. The filtering is necessary because of the out of band content added by baseband amplifiers, upmixer, and other components in the transmit path. Typically surface acoustic wave (SAW) filters are used to reduce out of band spectral content. SAW filters tend to use a significant surface area, and therefore require significant space. However, because mobile communication devices are sold in a cost and size sensitive market, it is desirable to eliminate these filters. This is especially true if the mobile communication device is designed to operate in more than one frequency band because a different filter will be required for each band, and radio frequency switches will be needed to switch the signals between the appropriate filters.

It has been found that filters can be avoided with the use of low noise mixers. Under nominal conditions the out of band spectral content introduced by the low noise mixers is low enough to be acceptable. However, if the gain of the power amplifier increases due to, for example, temperature changes of the power amplifier's active device, the out of band content gets amplified as well. Were it not for feedback, the increase in gain would cause both the in band and out of band signal content to become amplified. Of course, feedback prevents the in band content from being overamplified, but because the source of the out of band noise is not significantly affected by feedback, it is amplified more. Without filters the out of band content can be amplified to an unacceptable level and interfere with nearby receivers operating on nearby frequencies. The routine way of compensating for gain increases of lowering the input signal is ineffective because the out of band content is added by the mixer, and tends to be substantially constant. Therefore there is a need for a way to compensate for thermal effects on the power amplifier, in a low noise filterless transmitter.

DETAILED DESCRIPTION OF A PREFERRED EMBODIMENT

Figure 1:
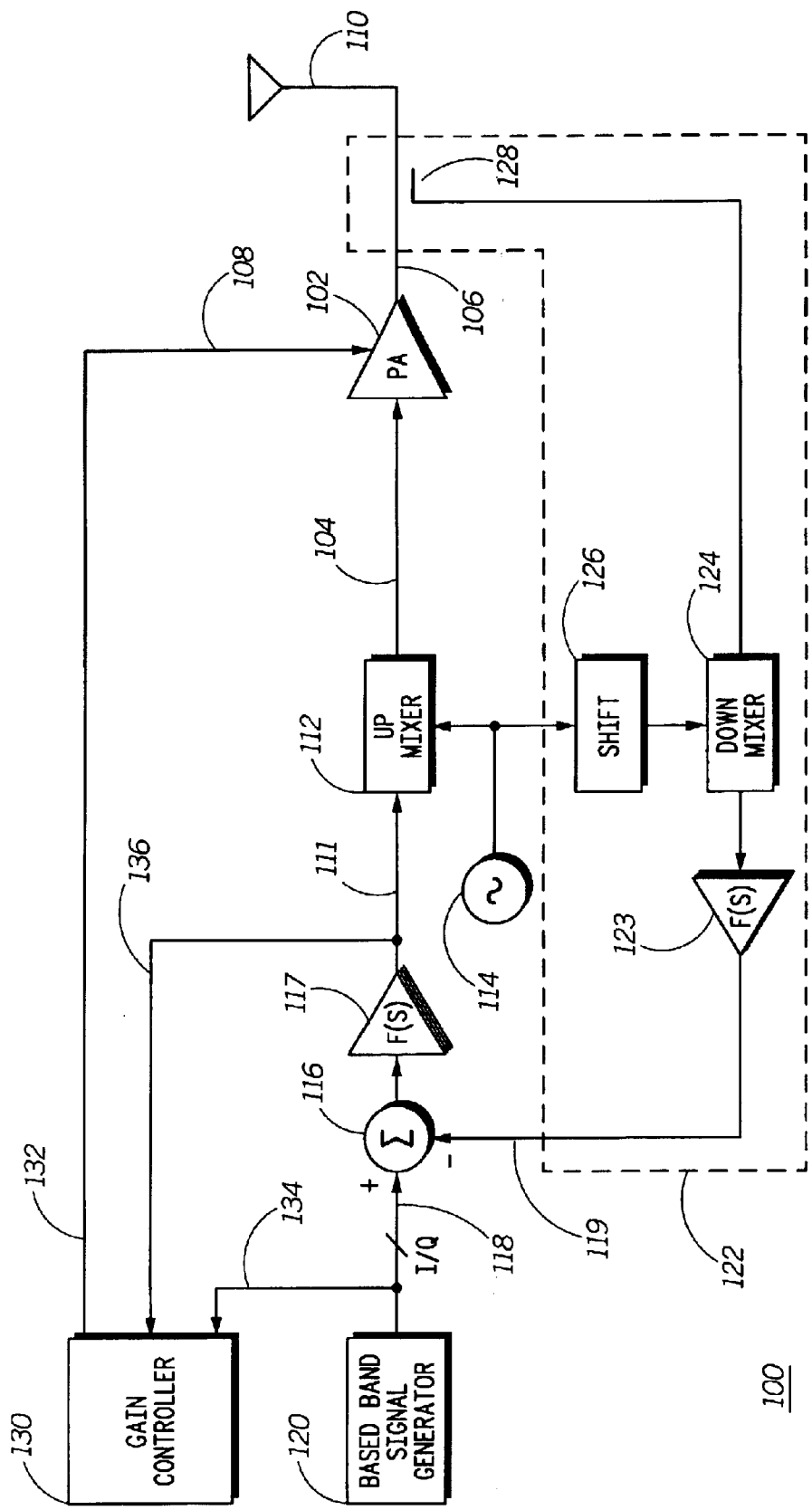
FIG. 1 shows a block diagram schematic of a low noise transmitter using Cartesian feedback in accordance with the invention.

While the specification concludes with claims defining the features of the invention that are regarded as novel, it is believed that the invention will be better understood from a consideration of the following description in conjunction with the drawing figures, in which like reference numerals are carried forward.

The invention solves the problem out of band content being introduced by components in the transmit path, such as the baseband amplifier and the up mixer and oscillator, where this out of band noise is subsequently amplified to undesirable levels in a transmitter employing Cartesian feedback. The problem is solved by monitoring signal levels of the baseband signal and the signal fed to the up mixer. A ratio of these levels is computed or otherwise determined, and the gain of the power amplifier is adjusted so as to maintain the ratio at a preferred level.

Referring now to FIG. 1, there is shown a block diagram schematic 100 of a low noise transmitter using Cartesian feedback, in accordance with the invention. The transmitter centers around a power amplifier 102. The power amplifier has an input 104, output 106, and a gain control input 108. The power amplifier is a radio frequency (RF) power amplifier, and amplifies a RF signal fed to the input 104 by a gain factor to provide an amplified RF signal at the output 106, which is coupled to an antenna 110. The gain of the power amplifier is adjustable, or otherwise able to be changed by changing the gain control signal fed to the gain control input 108. The RF signal fed to the input of the power amplifier is generated by an up mixer 112, and requires no filtering because the up mixer is a low noise mixer. However, it is contemplated that the invention may be used in application where filtering is present, as well, to avoid overdriving the upmixer, or maintaining a particular loop gain for stability reasons, or both. The up mixer mixes a signal fed to the input 111 of the up mixer with a RF carrier signal generated by a local oscillator 114 to produce the modulated RF signal fed to the power amplifier. This input signal is referred to as the amplified error signal. Since the transmitter uses Cartesian feedback, the signal fed to the up mixer is derived from a combiner 116. The combiner has first and second inputs 118, 119, respectively. The signals received at these inputs are combined in a way such that the effect is subtracting the second input from the first input. There are numerous ways this can be accomplished, such as directly subtracting one signal form the other, or placing an inverter in the path of one of the signals and summing them. The signal applied to the first input is the baseband signal, generated by a baseband signal generator 120. The baseband signal includes I & Q components. The signal applied to the second input of the combiner 116 is generated by a Cartesian feedback path 122. The output of the combiner is an error signal. Because the error signal will be a low level signal, it is amplified by a feedforward baseband amplifier 117 which amplifies the error signal and feeds the amplified error signal 111 to the upmixer 112. The feedforward baseband amplifier is designed to have a particular transfer function to set the loop bandwidth. Therefore, it can be seen that the amplified error signal 111 is related to the difference of the baseband signal 116 and the Cartesian feedback signal 119 produced by the Cartesian feedback path. Because of the transfer function of the feedforward baseband amplifier, the amplified error signal is not necessarily proportional to the error signal. The Cartesian feedback path comprises a feedback baseband amplifier 123, and a down mixer 124 which samples the output of the power amplifier through a coupling 128 and mixes it with the carrier signal generated by the local oscillator 114 and shifted by phase delay element 126. Similar to the feedforward baseband amplifier 117, the feedback baseband amplifier may be designed with selected poles and zeroes to set the loop bandwidth.

To control the gain of the power amplifier 102, a gain control circuit 130 samples the baseband signal 134 and the amplified error signal 136. The gain control circuit adjusts the gain of the power amplifier with a gain control signal 132. The initial gain setting is typically performed upon manufacture and testing of the transmitter, under controlled conditions. The initial gain setting is performed by opening the feedback loop and applying a test signal to the baseband generator to generate baseband signal. The gain of the power amplifier is then adjusted until the desired power output level is achieved, whereupon the feedback loop is closed. At that time, the ratio of the levels of the signal fed to the mixer 136 and the baseband signal 118 is determined, and is referred to as the preferred ratio. However, it is also contemplated that the ratio may be determined by design, and each transmitter built according to the design uses the same ratio. From then on, the gain control circuit adjusts the gain of the power amplifier to maintain the ratio at a value substantially equal to the preferred ratio.

To illustrate how the invention operates, consider the following example. Assume the preferred ratio has been determined and established by the gain control circuit 130. At some time thereafter, the transmitter experiences a change in temperature. Such a change in temperature may occur, for example, upon transmitting a signal and power amplifier power dissipation. In response, the gain of the power amplifier tends to change. The change in gain is reflected in the ratio of the amplified error signal and baseband signal as follows: The output power of the power amplifier would tend to change, but the Cartesian feedback path effectively adjusts the amplified error signal 111 to counteract the gain increase so that even though the amplifier gain may change, the output power of the signal is what it would be had the amplifier gain not increased. However, the conventional method fails to reduce the out of band noise because the Cartesian feedback path only adjusts the in band portion of the signal. However, by adjusting the gain of the power amplifier to maintain the ratio at a preferred value or at a substantially constant value that is substantially equal to the preferred value, the gain will be reduced when a temperature change has caused the gain of the power amplifier to tend to increase. Therefore the out of band spectral content is not amplified to an increased level, and remains below a preselected threshold. It will be appreciated by those skilled in the art that "substantially constant" means the fluctuation in value is tolerable for the design goals of the transmitter.

Figure 2:
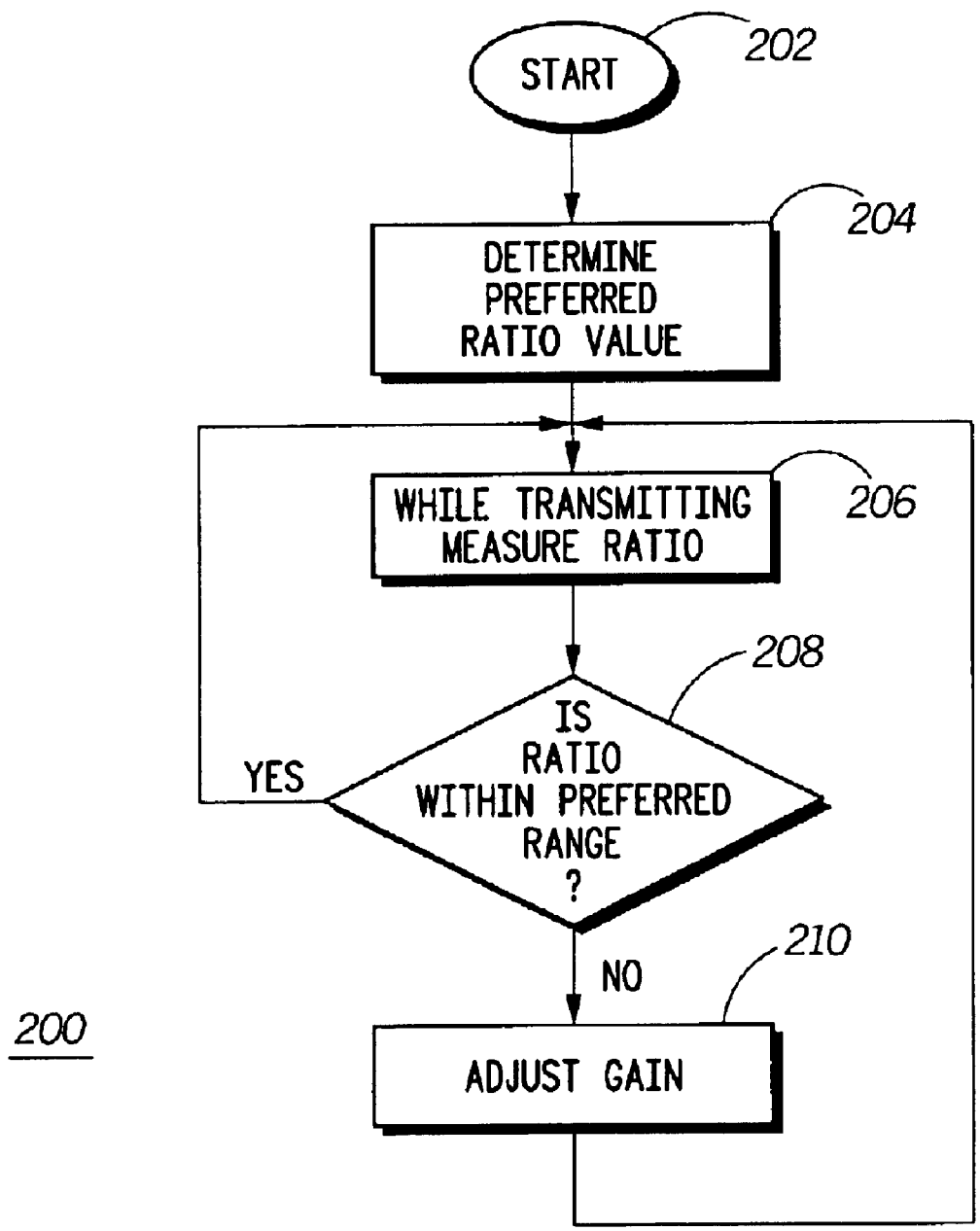
FIG. 2 shows a flow chart diagram of a method of operating a low noise transmitter using Cartesian feedback in accordance with the invention.

Referring now to FIG. 2, there is shown a flow chart diagram 200 of a method of operating a low noise transmitter using Cartesian feedback in accordance with the invention. At the start 202 of the procedure, the transmitter is built and first assembled. Shortly thereafter, the transmitter is tested to determine 204 a preferred ratio of the amplified error signal to the baseband signal. The precise value produced by this step may vary from transmitter to transmitter. The preferred ratio is then stored, either as a digital value or as a reference voltage, for example. When the transmitter begins transmitting, the gain control circuit is sampling the up mixer baseband and baseband signals and comparing them 206 as a ratio. In one embodiment of the invention, a range of acceptable values is determined for the ratio and if the present ratio is substantially equal to the preferred ratio determined in 204, no action is needed and the transmitting continues at the present gain setting. If the present ratio falls outside of the range of acceptable values, and is not substantially equal to the preferred ratio, the gain control circuit adjusts 210 the gain of the power amplifier via the gain control signal.

Because of the wide variety of applications a linear transmitter may be used in, there are a number of alternate embodiments of the invention. Generally, a low noise linear transmitter in accordance with the invention uses Cartesian feedback and comprises a power amplifier having an adjustable gain which is responsive to a gain control signal from gain control circuit. The transmitter has an up mixer for providing a radio frequency signal to the input of the power amplifier. A combiner is used to produce a signal that is the difference of first and second inputs to the combiner, which are the baseband signal and Cartesian feedback signal, respectively. The output of the combiner is fed to the input of the up mixer. A baseband signal generator generates the baseband signal from digital input, and includes I & Q components. The Cartesian feedback path is coupled between the output of the power amplifier and the second input of the combiner. The gain control circuit provides the gain control signal to the power amplifier in a manner than maintains a ratio of the baseband signal and the amplified error signal derived from the output of the combiner at a substantially constant value, within an acceptable range.

In a preferred embodiment of the invention, the ratio used by the gain control circuit is a ratio of the average of the input to the up mixer and an average of the baseband signal. That is, rather than calculate the ratio on a sample-by-sample basis, the gain control circuit averages these signals and compares the averages. The averages are running averages, where, for example, a present sample is averaged with the past nine samples to produce an average of ten samples. It is also preferred that the averages are only computed when the signals are below a threshold level to avoid sampling the signals when the signal causes the power amplifier to approach its gain compression point because distortion may affect the ratio. Furthermore, because an abrupt adjustment of gain will cause corruption of the information being transmitted, it is preferred that the gain control circuit determines an amount of adjustment needed, and adjusts the gain of the power amplifier by the amount of adjustment at a time when the transmitter is not transmitting. In time division systems where transmitting occurs at periodic time slots, the adjusting is performed after a transmit time slot, for example.

The method of operating the low noise linear transmitter to reduce out of band noise generated by the up mixer commences by first determining a preferred ratio of the amplified error signal over the baseband signal levels. This includes storing this value, either as digital information in a memory used by the gain control circuit, or as a reference voltage when an analog gain control circuit is used. During regular operation of the transmitter, the gain control circuit compares the signals for determining the present ratio of the up mixer baseband and baseband signal levels. The gain control circuit also controls adjusting the gain of the power amplifier to maintain the present ration substantially equal to the preferred ratio, within, for example, a preferred range. Because of the variation in transmitter design, feedback and feedforward amplification, and so on, the preferred value of the ratio will be different among various transmitter designs, so is left to engineering choice to determine the preferred value. Typically determining the preferred ratio is performed during manufacture of the transmitter, although it is contemplated it may be determined at other times, such as if the transmitter is designed with self-testing ability, or simply by design if the tolerances of the components in the transmitter are small enough.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A low noise linear transmitter using Cartesian feedback, comprising:

a power amplifier having an input and an output and an adjustable gain, the adjustable gain responsive to a gain control signal;

an up mixer for providing a radio frequency signal to the input of the power amplifier, and having an input;

a combiner having a first input, a second input, and a output, the output of the combiner being the difference of the first and second inputs and operatively coupled to the input of the up mixer;

a baseband signal generator for generating a baseband signal, the baseband signal being provided to the first input of the combiner;

a Cartesian feedback path coupled between the output of the power amplifier and the second input of the combiner; and a gain control circuit for providing the gain control signal to the power amplifier in a manner than maintains a ratio of the base band signal and the output of the combiner at a substantially constant value.

2. A low noise transmitter as defined in claim 1, wherein the ratio used by the gain control circuit is a ratio of the average of the input to the up mixer and an average of the baseband signal.

3. A low noise transmitter as defined in claim 2, wherein the average of the input to the power amplifier and the baseband signal are only computed when they are below a threshold level.

4. A low noise transmitter as defined in claim 1, wherein the gain control circuit determines an amount of adjustment needed, and adjusts the gain of the power amplifier by the amount of adjustment at a time when the transmitter is not transmitting.

5. A low noise transmitter as defined in claim 1, wherein the gain control circuit maintains the ratio at a substantially constant level determined at manufacture of the transmitter.

6. A low noise transmitter as defined in claim 1, wherein the up mixer output is fed to the power amplifier input without an intervening filter.

7. A method of operating a low noise linear transmitter to reduce out of band noise generated by an up mixer; the transmitter having a power amplifier for amplifying the output of the up mixer, a baseband signal generator for providing a baseband signal, a Cartesian feedback path for modifying the baseband signal to provide an amplified error signal to the up mixer, the method comprising:

determining a preferred ratio of the amplified error signal over the baseband signal levels;

determining a present ratio of the up mixer baseband and baseband signal levels; and adjusting a gain of the power amplifier in response to the comparing to maintain the present ration substantially equal to the preferred ratio.

8. A method of operating a low noise linear transmitter as defined in claim 7, wherein determining the preferred ratio is performed during manufacture of the transmitter.

9. A method of operating a low noise linear transmitter as defined in claim 7, wherein determining the present ratio is performed when the up mixer baseband and baseband signals are below a preselected threshold.

10. A method of operating a low noise linear transmitter as defined in claim 7, wherein adjusting the gain of the power amplifier is performed when the power amplifier is not transmitting.

11. A method of operating a low noise transmitter as defined in claim 7, wherein determining the present ratio comprises averaging the up mixer baseband and baseband signals.

* * * * *